(12) United States Patent
Choi et al.

(10) Patent No.: US 10,482,824 B2
(45) Date of Patent: Nov. 19, 2019

(54) DIGITAL-TO-ANALOG CONVERTER, DATA DRIVER AND DISPLAY APPARATUS INCLUDING THE SAME

(71) Applicant: DB HiTek Co., Ltd., Bucheon-si (KR)

(72) Inventors: Kee Joon Choi, Bucheon-si (KR); Hae Taek Kim, Bucheon-si (KR); Sang Gi Lee, Bucheon-si (KR)

(73) Assignee: DB HiTek Co., Ltd., Bucheon-Si (KR)

( * ) Notice: Subject to any disclaimer, the term of this patent is extended or adjusted under 35 U.S.C. 154(b) by 0 days.

(21) Appl. No.: 15/915,582

(22) Filed: Mar. 8, 2018

(65) Prior Publication Data
US 2018/0342210 A1 Nov. 29, 2018

(30) Foreign Application Priority Data
May 26, 2017 (KR) ............... 10-2017-0065094

(51) Int. Cl.
  *G09G 3/3275* (2016.01)
  *H03M 1/76* (2006.01)
  *G09G 3/36* (2006.01)

(52) U.S. Cl.
  CPC ......... *G09G 3/3275* (2013.01); *G09G 3/3688* (2013.01); *G09G 3/3696* (2013.01); *H03M 1/76* (2013.01); *G09G 2310/027* (2013.01); *G09G 2310/0289* (2013.01); *G09G 2310/0297* (2013.01); *G09G 2330/021* (2013.01)

(58) Field of Classification Search
  CPC .. G09G 3/3275; G09G 3/3688; G09G 3/3696; G09G 2130/0297; G09G 2310/027; G09G 2310/0289; G09G 2330/021; H03M 1/76
  See application file for complete search history.

(56) References Cited

U.S. PATENT DOCUMENTS

| | | | | |
|---|---|---|---|---|
| 5,703,588 A | * | 12/1997 | Rivoir | H03M 1/0604 341/118 |
| 2006/0232520 A1 | * | 10/2006 | Park | G09G 3/3291 345/76 |
| 2010/0141494 A1 | * | 6/2010 | Lee | H03M 1/682 341/144 |
| 2013/0062680 A1 | * | 3/2013 | Kato | H01L 29/66825 257/316 |
| 2013/0082852 A1 | * | 4/2013 | Coban | H03M 1/20 341/110 |
| 2015/0339962 A1 | * | 11/2015 | Ryu | G09G 3/20 345/208 |
| 2018/0358978 A1 | * | 12/2018 | Wang | G09G 3/3208 |
| 2019/0081616 A1 | * | 3/2019 | Iida | H03K 3/012 |

* cited by examiner

*Primary Examiner* — Premal R Patel
(74) *Attorney, Agent, or Firm* — Andrew D. Fortney; Central California IP Group, P.C.

(57) ABSTRACT

A voltage generator configured to generate a plurality of voltage groups, each of the plurality of voltage groups including a plurality of reference voltages, and a decoder having an output node configured to output one of the plurality of reference voltages is disclosed. The decoder includes switch blocks that correspond to the plurality of voltage groups. Each of the switch blocks includes transistors that are turned on or off by or in response to a control signal, and each transistor in one of the switch blocks has a channel width different from a channel width of each transistor in another one of the switch blocks.

17 Claims, 4 Drawing Sheets

DIGITAL-TO-ANALOG CONVERTER, DATA DRIVER AND DISPLAY APPARATUS INCLUDING THE SAME

This application claims the benefit of Korean Patent Application No. 10-2017-0065094, filed on May 26, 2017, which is hereby incorporated by reference as if fully set forth herein.

BACKGROUND OF THE INVENTION

Field of the Invention

Embodiments of the present invention relate to a data driver and a display apparatus including the same.

Discussion of the Related Art

A resistor string (i.e., an R-string) is widely used as a digital-to-analog converter in a data driver for driving data lines of a display panel.

In some digital-to-analog converters, switches may be turned on or turned off on the basis of the digital input data, and one of the voltages distributed by the resistor string, which is composed of serially connected resistors, is output as an analog signal, in accordance with the states of such switches.

Here, the switches may comprise one or more transistors having the same size, such that the switches can endure the same breakdown voltage. However, high-voltage transistors are used as switches for the DAC in data drivers used for OLED TVs, compared to switches for the DAC in data drivers used for LCD TVs. Accordingly, when a DAC is implemented using high-voltage transistors having the same size as in OLED TVs, the area of the DAC may increase, and the chip size of the element including the DAC implemented using the high-voltage transistors (for example, the data driver) may increase.

SUMMARY OF THE INVENTION

Embodiments of the present invention provide a data driver capable of reducing a chip size and power consumption, and a display apparatus including the same.

A digital-to-analog converter according to one or more embodiments includes a voltage generator configured to generate a plurality of voltage groups, each of the plurality of voltage groups having a plurality of reference voltages; and a decoder having an output node configured to output one of the plurality of reference voltages from any of the plurality of voltage groups, wherein the decoder includes switch blocks that correspond to the plurality of voltage groups, each of the switch blocks includes transistors that are turned on or off by or in response to a control signal, and each transistor in one of the switch blocks has a channel width different from a channel width of each transistor in another one of the switch blocks.

The decoder may further include connection nodes between the switch blocks and the output node, and the connection nodes may have different widths.

The decoder may further include first to (m−1)-th connection transistors between a first connection node and an m-th (m being a natural number greater than 1) connection node, the first connection node is directly connected to a first transistor in a first one of the switch blocks and a second transistor in a second one of the other switch block, and the m-th connection node is directly connected to two neighboring (m−1)-th connection transistors.

Each of the (m−1)-th connection transistors may be between the (m−1)-th connection node and the m-th connection node.

The transistors in one of the switch blocks may have a size greater than that of the transistors in another one of the switch blocks, and the reference voltages corresponding to the one of the switch blocks may be higher than the reference voltages corresponding to the other one of the switch blocks.

The transistors in one of the switch blocks may have a breakdown voltage that is higher than that of the transistor in the other one of the switch blocks, and the reference voltages corresponding to the one of the switch blocks may be higher than the reference voltages corresponding to the other one of the switch blocks.

The (m−1)-th connection transistors may have different channel widths.

One of the (m−1)-th connection transistors may have a size that is greater than a size of another one of the (m−1)-th connection transistors, and a voltage to the (m−1)-th connection node to which one end of the one (m−1)-th connection transistor is connected may be higher than a voltage to the (m−1)-th connection node to which one end of the other (m−1)-th connection transistor is connected.

A breakdown voltage of the one of the (m−1)-th connection transistors may differ from that of the other one of the (m−1)-th connection transistors.

The breakdown voltage of the one of the (m−1)-th connection transistors may be higher than that of the other one of the (m−1)-th connection transistors, and a voltage to the (m−1)-th connection node to which one end of the one (m−1)-th connection transistor is connected may be higher than a voltage to the (m−1)-th connection node to which one end of the other (m−1)-th connection transistor is connected.

The one of the (m−1)-th connection transistors may have the same size as a size of the transistors of the first switch block, and the first switch block may receive reference voltages equal to or higher than a voltage of an (m−1)-th connection node to which the one end of the one (m−1)-th connection transistor is connected.

Breakdown voltages of transistors of each switch block may be equal to or higher than a maximum reference voltage of the reference voltages corresponding to the switch block.

The voltage generator may include reference voltage output nodes configured to output the plurality of reference voltages, and transistors of the switch blocks may be in a binary tree structure between the reference voltage output nodes and the first connection node.

The first to (m−1)-th connection transistors may be in a binary tree structure between the first to m-th connection nodes.

The m-th connection node may be the output node of the decoder.

The voltage generator may include a resistor string including serially connected resistors, and the reference voltage output nodes may include a connection node of two neighboring resistors of the serially connected resistors.

The channel width of the one of the (m−1)-th connection transistors may have a value between the channel widths of two (m−2)-th connection transistors directly connected to an (m−1)-th connection node to which the one (m−1)-th connection transistor is connected.

A data driver according to various embodiments includes a data storage unit configured to store a data signal; a level shifting block configured to shift a voltage level of the data signal and output a level-shifted data signal; and the analog-to-digital converter according to one or more embodiments of the present invention, configured to output one of the plurality of reference voltages based on or in response to the level-shifted data signal.

A display apparatus according to various embodiments of the present invention includes a display panel including gate lines in rows, data lines in columns and intersecting the gate lines in a matrix, and pixels each connected to respective gate lines and intersecting data lines; a gate driver configured to drive the gate lines; and the data driver according to one or more embodiments of the present invention, configured to drive the data lines.

Embodiments of the invention may reduce a chip size and power consumption of a chip including the data driver.

DETAILED DESCRIPTION OF THE INVENTION

Figure 1:
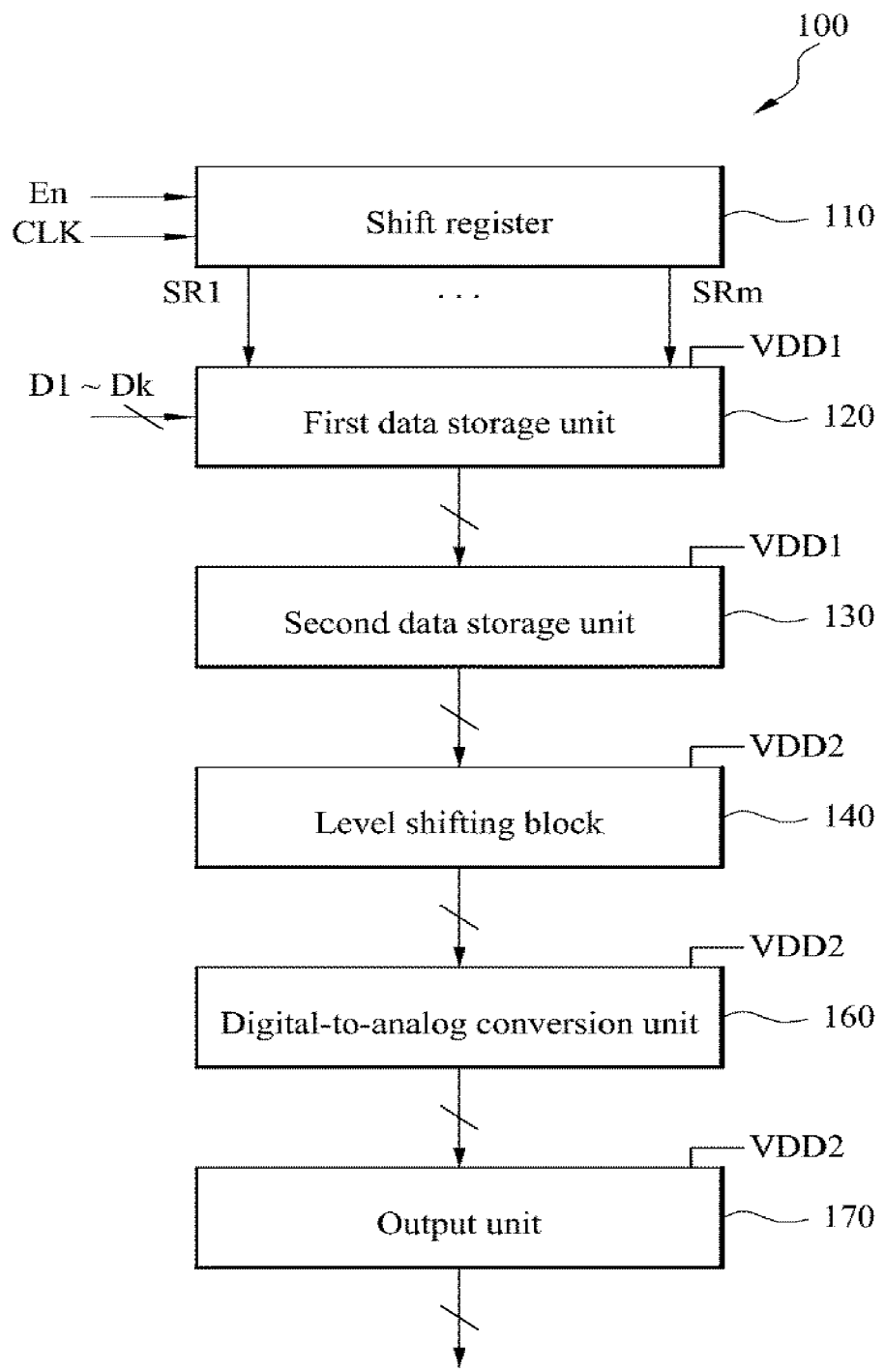
FIG. 1 is a block diagram of an exemplary data driver according to embodiments of the present invention.

Embodiments will be described more fully hereinafter with reference to the accompanying drawings, in which exemplary embodiments of the invention are shown. In the following description of the embodiments, it will be understood that, when an element such as a layer (film), region, pattern, or structure is referred to as being "on" or "under" another element, it can be "directly" on or under another element or can be "indirectly" on or under the other element with intervening elements therebetween. Also, terms such as "on" or "under" should be understood on the basis of the drawings.

In the drawings, dimensions of layers are exaggerated, omitted or schematically illustrated for clarity and convenience of description. In addition, dimensions of constituent elements do not entirely reflect actual dimensions thereof. Like reference numerals refer to like elements throughout the drawings.

Figure 2:
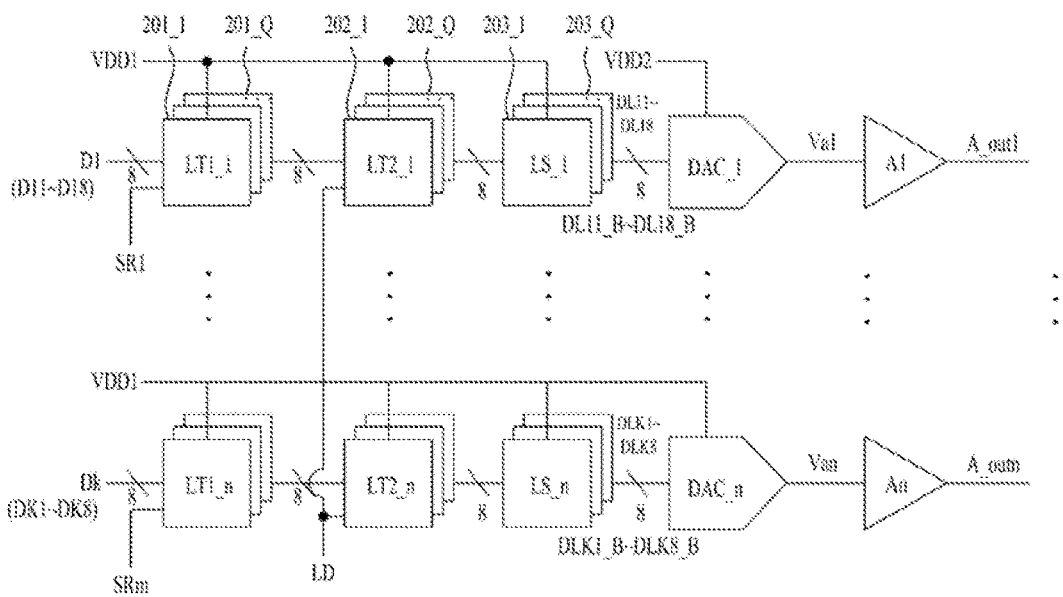
FIG. 2 illustrates one or more embodiment(s) of a first data storage unit, a second data storage unit, a level shifting block, a digital-to-analog converter, and an output unit suitable for use in the data driver of FIG. 1.

FIG. 1 is a block diagram of an exemplary data driver 100 according to one or more embodiments of the present invention. FIG. 2 illustrates one or more embodiment(s) of a first data storage unit, a second data storage unit, a level shifting block, a digital-to-analog conversion unit, and an output unit suitable for use in the data driver of FIG. 1.

Referring to FIG. 1, the data driver 100 includes a shift register 110, a first data storage unit 120, a second data storage unit 130, a level shifting block 140, a digital-to-analog conversion unit 160 and an output unit 170.

The shift register 110 generates shift signals SR1 to SRm (m being a natural number greater than 1) in response to an enable signal En and a clock signal CLK that control the timing at which data (e.g., digital image data) is sequentially stored in the first latch unit 120.

For example, the shift register 110 may generate the shift signals SR1 to SRm (m being a natural number greater than 1) in response to receiving a horizontal start signal from a timing controller (e.g., 205 in FIG. 6) and shifting the received horizontal start signal in response to the clock signal CLK. Here, the horizontal start signal may be referred to as a start pulse.

The first data storage unit 120 stores data D1 to Dk received from the timing controller (e.g., 205 in FIG. 6) in response to the shift signals SR1 to SRm (m being a natural number greater than 1) from the shift register 110.

Referring to FIGS. 1 and 2, the first data storage unit 120 (FIG. 1) may include a plurality of first latch units LT1_1 to LT_n (n being a natural number greater than 1; FIG. 2).

The plurality of first latch units LT1_1 to LT_n (n being a natural number greater than 1) may be divided into a plurality of groups.

Each of the plurality of first latch units LT1_1 to LT_n (n being a natural number greater than 1) may include Q first latches 201_1 to 201_Q, which store Q-bit (e.g., Q=8) data signals.

The second data storage unit 130 stores the Q-bit data signals from the first data storage unit 120 in response to a first control signal LD. For example, the second data storage unit 130 may store the data signals from the first data storage unit 120 in units of a horizontal line period.

For example, the horizontal line period may refer to a period of time to store all data signals corresponding to one horizontal line (e.g., 204 in FIG. 6) of a display panel (e.g., 201 in FIG. 6) in the first latch units LT1_1 to LT_n (n being a natural number greater than 1) of the first data storage unit 120.

The second data storage unit 130 may include a plurality of second latch units LT2_1 to LT2_$n$ (n being a natural number greater than 1) corresponding to the first latch units LT1_1 to LT_n (n being a natural number greater than 1).

Each of the plurality of second latch units LT2_1 to LT2_$n$ (n being a natural number greater than 1) may include second latches (e.g., 202-1 to 202-Q) corresponding to the first latches 201_1 to 201_Q, in each of the first latch units LT1_1 to LT1_$n$.

The second latches 202_1 to 202_Q may store Q-bit (e.g., Q=8) data signals. The number of second latches may be the same as the number of first latches.

The plurality of second latch units LT2_1 to LT2_$n$ (n being a natural number greater than 1) may store data signals from the first latch units LT1_1 to LT1_$n$ (n being a natural number greater than 1) in response to the first control signal LD.

For example, data signals D11 to D18 through DK1 to DK8 respectively stored in the first latch units LT1_1 to LT1_$n$ (n being a natural number greater than 1) may be simultaneously stored in the second latch units LT2_1 to LT2_$n$ (n being a natural number greater than 1) in response to the first control signal LD.

The level shifting block 140 is configured to shift voltage levels of the data signals D11 to D18 through DK1 to DK8 from the second data storage unit 130.

The driving voltage VDD2 of the level shifting block 140 may differ from the driving voltage VDD1 of the first data storage unit 120 and the second data storage unit 130. For example, VDD2 may be higher than VDD1.

The level shifting block 140 may include a plurality of level shifter units LS_1 to LS_n (n being a natural number greater than 1).

Each of the plurality of level shifter units LS_1 to LS_n (n being a natural number greater than 1) may correspond to a unique one of the second latch units LT2_1 to LT2_n (n being a natural number greater than 1).

Each of the plurality of level shifter units LS_1 to LS_n may include level shifters (e.g., 203-1 to 203-Q) corresponding to the second latches.

The plurality of level shifter units LS_1 to LS_n may shift the voltage levels of data signals from the second latch units LT2_1 to LT2_n (n being a natural number greater than 1) and output level-shifted data signals having shifted voltage levels, and optionally, inverted level-shifted data signals.

For example, the level shifter unit LS_1 may output level-shifted data signals DL11 to DL18 and inverted level-shifted data signals DL11_B to DL18_B in response to the data signals D11 to D18 from the second latch unit LT2_1.

The level shifters 203-1 to 203-Q may shift the voltage level of the individual data signals D11 through D18 and the inverted individual data signals D11_B through D18-B, and output level-shifted data signals DL11 to DL18 and inverted level-shifted data signals DL11_B to DL18_B, in accordance with the voltage level-shifting function.

Although the level shifters 203-1 to 203-Q output 8-bit level-shifted data signals DL11 to DL18 and 8-bit inverted level-shifted data signals DL11_B to DL18_B in FIG. 2, embodiments are not limited thereto.

For example, the level shifter 203-1 may shift the levels of the data signal D11 and the inverted data signal D11_B from the second latch 202-1 and output the level-shifted data signal DL11 and the inverted level-shifted data signal DL11_B.

Here, the inverted data signal D11_B may be a signal obtained by inverting the data signal D11, and the level shifter unit LS_1 may include an inverter (not shown) which inverts the data signal D11 and outputs the inverted data signal D11_B.

The digital-to-analog conversion unit 160 (FIG. 1) converts the level-shifted data signals DL11 to DL18 and the inverted level-shifted data signals DL11_B to DL18_B that are digital signals into analog signals Va1 to Van (n being a natural number greater than 1).

The output unit 170 receives the analog signals Va1 to Van from the digital-to-analog conversion unit 160, amplifies or buffers the received analog signals Va1 to Van, and outputs amplified and/or buffered signals.

For example, the output unit 170 may comprise an amplifier and/or a buffer. However, the output unit 170 is not limited thereto.

The digital-to-analog conversion unit 160 may include a plurality of digital-to-analog converters DAC_1 to DAC_n (n being a natural number greater than 1; FIG. 2) corresponding to the level shifters LS_1 to LS_n.

Each of the digital-to-analog converters DAC_1 to DAC_n may convert the digital output of one of the level shifter units LS_1 to LS_n corresponding thereto to an analog signal.

Figure 3:
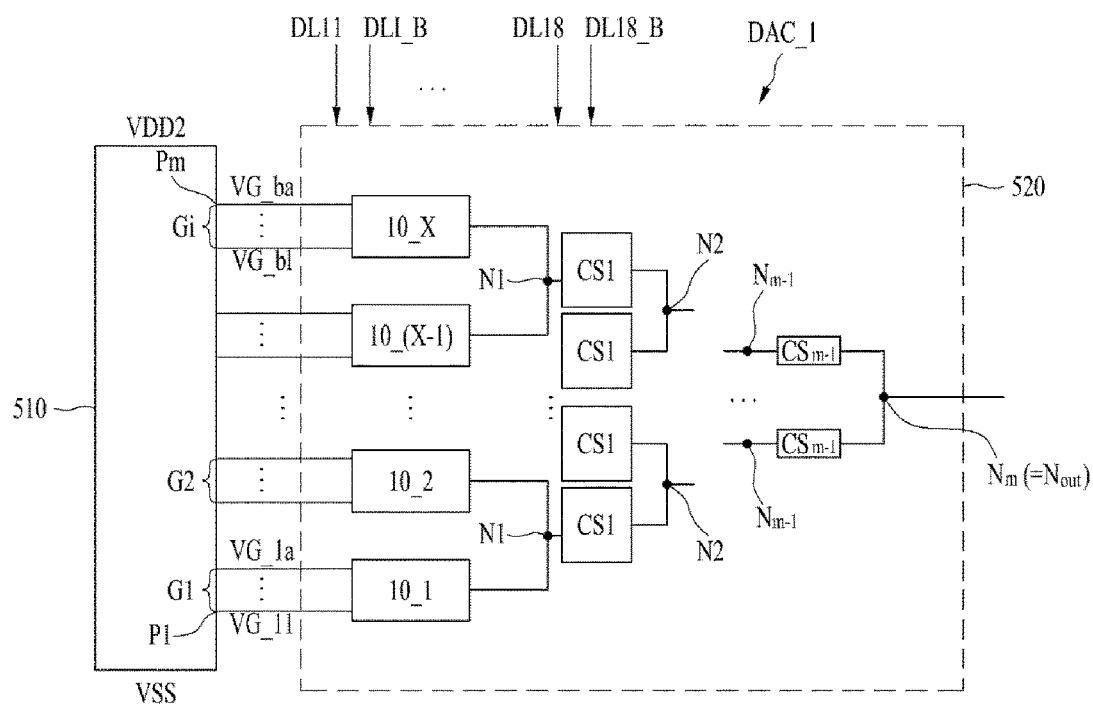
FIG. 3 illustrates an exemplary digital-to-analog converter according to one or more embodiments of the present invention.
Figure 4:
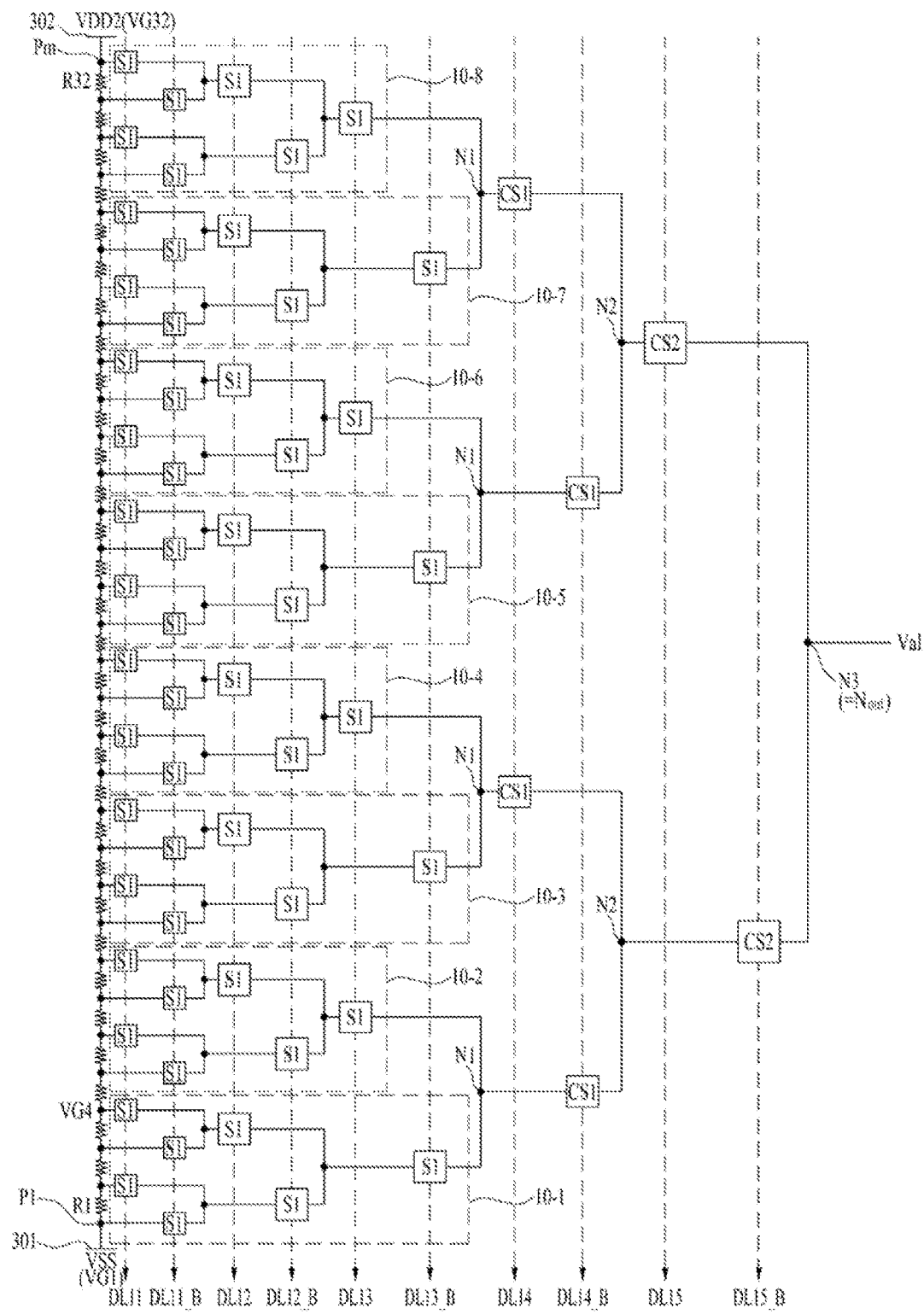
FIG. 4 illustrates an example of the digital-to-analog converter of FIG. 3.

FIG. 3 illustrates an exemplary digital-to-analog converter DAC-1 according to one or more embodiments. FIG. 4 illustrates an example of a digital-to-analog converter suitable for the digital-to-analog converter DAC-1 of FIG. 3.

The digital-to-analog converters DAC_2 to DAC_n in FIG. 2 may be implemented using the same structure as the digital-to-analog converter DAC_1 shown in FIG. 3.

Referring to FIG. 3, the digital-to-analog converter DAC_1 may include a voltage generator 510 and a decoder 520.

The voltage generator 510 may generate a plurality of voltage groups G1 to Gi (i being a natural number greater than 1), each of which includes a respective plurality of reference voltages VG_11 to VG_1a through VG_b1 to VG_ba (where each of a and b>1).

The plurality of voltage groups G1 to Gi may be within a voltage range between a voltage VSS of a first power supply (e.g., 301 in FIG. 4) and a voltage VDD2 of a second power supply (e.g., 302 in FIG. 4) and may include different voltage ranges. For example, the plurality of voltage groups may have sequential and consecutive voltage ranges between the voltage VSS of the first power supply 301 and the voltage VDD2 of the second power supply 302. For example, the voltage VSS of the first power supply 301 is lower than the voltage VDD2 of the second power supply 302 (e.g., VSS<VDD).

For example, when the voltage VSS of the first power supply 301 is 0V and the voltage VDD2 of the second power supply 302 is 32V, the voltage generator 510 may generate 8 voltage groups G1 to Gi (i=8) having different voltage ranges, and each voltage group may include a plurality of reference voltages that may have a predetermined voltage difference therebetween (e.g., 1V).

The voltage generator 510 may include reference voltage output nodes P1 to Pm (m>a and b>1, where m, a and b are natural numbers) through which the plurality of reference voltages VG_11 to VG_1a through VG_b1 to VG_ba are output.

For example, the voltage generator 510 comprises a resistor string (i.e., R-string) that includes resistors (e.g., R1 to R32, as shown in FIG. 4) serially connected between the first power supply 301 and the second power supply 302.

The number of resistors in the resistor string may be determined by the number of bits for digital-to-analog conversion. For example, the resistor string 510 may include 2n−1 or 2n resistors when the number of bits for digital-to-analog conversion is n. However, the number of resistors in the resistor string is not limited thereto.

For example, the voltage generator 510 may (i) distribute the voltage VDD2 of the second power supply 302 (for example, the driving voltage VDD2 of the level shifting block 140) according to the serially connected resistor string, (ii) generate the plurality of reference voltages VG_11 to VG_1a to VG_b1 through VG_ba having different levels based on (e.g., in response to) the voltage distribution along the resistor string (R-string), and (iii) output the generated reference voltages (e.g., grayscale voltages) on the reference voltage output nodes P1 to Pm.

For example, the reference voltage output nodes P1 to Pm may be connection nodes of the R-string of the voltage generator 510.

The connection nodes of the R-string may include first connection nodes between two neighboring resistors among the serially connected resistors R1 to R32.

For example, the connection nodes of the R-string may further include at least one of a second connection node between the first power supply 301 and the first resistor R1 and a third connection node between the second power supply 302 and the last resistor R32.

For example, the output nodes P1 to Pm of the voltage generator 510 may include the aforementioned first connection nodes, second connection node and third connection node.

For example, the voltage generator 510 in FIG. 3 may be shared by the digital-to-analog converters DAC-1 to DAC-n.

The decoder 520 of FIG. 3 decodes control signals and outputs one of the reference voltages VG_11 to VG_1a through VG_b1 to VG_ba as an analog signal Val, according to the data signals DL11 through DL18-B. For example, the control signals may be level-shifted data signals and inverted level-shifted data signals from the level shifters 203-1 to 203-Q in FIG. 2.

Referring to FIG. 3, the decoder 520 may receive control signals DL11 to DL18 through DL11_B to DL18_B and output one of the plurality of reference voltages VG_11 to VG_ba from the voltage generator 510 through an output node $N_{out}$.

For example, as shown in FIG. 4, the decoder may output one of reference voltages VG1 to VG32 from the R-string through the output node $N_{out}$ on the basis of the control signals DL11 to DL15 and DL11_B to DL15_B.

The decoder may include switch blocks 10_1 to 10_X (X being a natural number greater than 1) corresponding to the plurality of voltage groups G1 to Gi, first to m-th connection nodes N1 to Nm (m being a natural number greater than 1), and first to (m−1)-th connection transistors C_1 to CS_m−1.

The m-th connection node Nm may be the output node $N_{out}$ of the decoder 520.

Reference voltages VG_11 to VG_1a, VG_b1 to VG_ba, or one of the other voltage groups corresponding to the switch blocks 10_1 to 10_X may be provided to a corresponding switch block.

For example, the reference voltages VG_11 to VG1a (FIG. 3) may be provided to the switch block 10_1. Alternatively, the reference voltages VG1 to VG4 (FIG. 4) may be provided to the switch block 10_1.

Referring to FIG. 4, transistors S1 of each of the switch blocks 10_1 to 10_X (X being a natural number greater than 1) are connected to reference voltage output nodes belonging to the voltage group corresponding to that switch block.

For example, the transistors S1 may be connected in a binary tree structure between the reference voltage output nodes P1 to Pm and the first connection node N1.

Each of the switch blocks 10_1 to 10_X (X being a natural number greater than 1) may include transistors S1 between the reference voltage output nodes on which the reference voltages of the voltage group corresponding thereto are output and the first connection node N1.

Referring to FIG. 4, two neighboring switch blocks 10-(x−1) and 10-x (x is an integer from 2 to 8) may be connected to each other at the first connection node N1.

For example, the first connection node N1 may be a node at which two neighboring switch blocks 10-(x−1) and 10-x among the switch blocks 10-1 to 10-8 are connected to each other.

For example, the first connection node N1 may be a node at which a transistor in one switch block 10-(x−1) of two adjacent switch blocks is connected to a transistor in the other adjacent switch block 10-x.

Each of the (m−1)-th connection transistors CSm−1 (FIG. 3) may be between the (m−1)-th connection node $N_{m-1}$ and the m-th connection node $N_m$.

For example, the (m−1)-th connection transistors CSm−1 may be between two (m−1)-th connection nodes $N_{m-1}$ and one m-th connection node $N_m$ corresponding thereto.

For example, the first connection transistor CS1 may be between the first connection node N1 and the second connection node N2, when m=2.

The (m−1)-th connection node $N_{m-1}$ may be a node at which two neighboring (m−2)-th connection transistors CSm-2 (not shown) are directly connected to each other.

The m-th connection node $N_m$ may be a node at which two neighboring (m−1)-th connection transistors CSm-1 are directly connected to each other. For example, the third connection node N3 (FIG. 4) may be a node at which two neighboring second connection transistors CS2 are directly connected to each other, when m=3.

For example, there may be a plurality of second connection nodes N2 and (m−1)-th connection nodes $N_{m-1}$ (FIG. 3). The m-th connection node may be the output node $N_{out}$ and there may be one m-th connection node $N_m$. However, the m-th connection node $N_m$ is not limited thereto.

The transistors S1 of the switch blocks 10_1 to 10_X and the first to (m−1)-th connection transistors CS1 to $CS_{m-1}$ may be turned on or turned off in response to control signals DL11 to DL13 and DL11_B to DL13_B (FIG. 3) and DL14-DL15 and DL14_B-DL15_B, respectively.

The transistors S1 and the first to (m−1)-th connection transistors CS1 to $CS_{m-1}$ may comprise at least one of an NMOS transistor and a PMOS transistor.

The transistors S1 of the switch blocks 10-1 to 10-8 may have the same size.

For example, the transistors S1 of each switch block 10-1 to 10-8 may have a predetermined size, such that a breakdown voltage of the transistors S1 may be equal to or higher than a maximum reference voltage among the reference voltages (e.g., VG_11 to VG_1a, VG_b1 to VG_ba, etc.) to the corresponding switch block.

For example, the size of a transistor may be the channel width or the gate width of the transistor.

Figure 5:
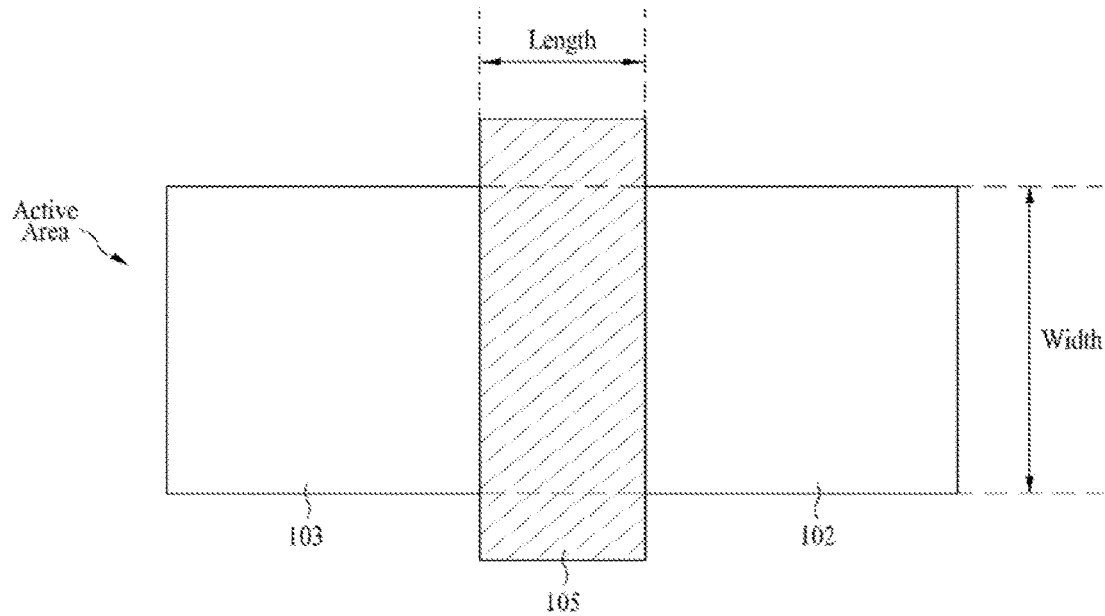
FIG. 5 is a conceptual diagram for describing a transistor size.

FIG. 5 is an exemplary conceptual diagram describing a transistor size.

Referring to FIG. 5, the transistor may include a gate 105 on an active area of a substrate (not shown), a source 102 in the active area at one side of the gate 105, and a drain 103 in the active area at the opposite side of the gate 105.

The length of the gate 105 on or over the active area in a first direction may also be the length of a channel of the transistor. For example, the first direction may be a direction toward the drain from the source, or vice versa.

The length of the gate 105 on or over the active area in a second direction may be the width of the channel or the width of the gate 105 of the transistor. For example, the second direction may be perpendicular to the first direction.

The transistors S1 in each of the switch blocks 10_1 to 10_X of FIG. 4 have a different size from the transistors S1 in another switch block.

For example, the size of the transistors S1 (FIG. 4) in one (e.g., 10_2) of the switch blocks 10_1 to 10_X of FIG. 3 may be greater than the size of the transistors S1 in another one (e.g., 10_1) of the switch blocks 10_1 to 10_X. The size of the transistors in each switch block may increase as the range of reference voltages input into and/or received by the switch block increases.

Furthermore, the transistors S1 (FIG. 4) in each of the switch blocks 10_1 to 10_X of FIG. 3 may have a different breakdown voltage from that of the transistors S1 in other switch blocks.

For example, the breakdown voltage of the transistors S1 (FIG. 4) in one (e.g., 10_2) of the switch blocks 10_1 to 10_X of FIG. 3 may be higher than that of the transistors S1 in another one (e.g., 10_1) of the switch blocks 10_1 to 10_X of FIG. 4. The breakdown voltage of the transistors in each switch block may increase as the range of reference voltages input into and/or received by the switch block increases.

Here, reference voltages (e.g., VG_21 to VG_2a; FIG. 3) provided to one (e.g., 10_2) of the switch blocks 10_1 to 10_X are higher than reference voltages (e.g., V11 to V1a) provided to another one (e.g., 10_1) of the switch blocks 10_1 to 10_X.

The (m−1)-th connection transistors CSm−1 may have different sizes (e.g., different channel widths).

For example, the size of one of the (m−1)-th connection transistors CSm−1 may be greater than another one of the (m−1)-th connection transistors CSm−1.

Furthermore, the breakdown voltage of one of the (m−1)-th connection transistors CSm−1 may differ from that of another one of the (m−1)-th connection transistors CSm−1.

For example, the breakdown voltage of the (m−1)-th connection transistor CSm−1 receiving a voltage from a switch group that receives a relatively high range of reference voltages may be higher than that of another (m−1)-th connection transistor CSm−1 receiving a voltage from a switch group that receives a relatively low range of reference voltages.

Here, the voltage on an (m−1)-th connection node $N_{m-1}$ to which one end of one of the (m−1)-th connection transistors CSm−1 is connected may be higher than a voltage on another (m−1)-th connection node $N_{m-1}$ to which one end of another one of the (m−1)-th connection transistors CSm−1 is connected.

The size of the one of the (m−1)-th connection transistors CSm−1 may be the same as the size of the transistors of the Xth switch block (e.g., 10_X) of the switch blocks 10_1 to 10_X.

Here, the switch block may be a switch block having reference voltages equal to or higher than the voltage of the (m−1)-th connection node to which the one end of the one of the (m−1)-th connection transistors is connected.

The size of the second connection transistor CS2 in the upper part of FIG. 4 may be the same as the size of the transistors S1 of the switch block (e.g., 10-8) having a reference voltage equal to or higher than the voltage of the second node N2 in the upper part of FIG. 4.

In addition, the channel width of each (m−1)-th connection transistor CSm−1 (FIG. 3) may differ from that of each (m−2)-th connection transistors CSm−2 (not shown).

For example, the channel width of a first connection transistor CS1 (FIG. 4) may differ from that of a second connection transistor CS2.

In addition, the channel width of one of the (m−1)-th connection transistors CSm−1 (FIG. 3) may have a value between the channel widths of two (m−2)-th connection transistors CSm−2 (not shown) directly connected to the (m−1)-th connection nodes $N_{m-1}$ to which the one (m−1)-th connection transistor CSm−1 is connected.

For example, referring to FIG. 4, the channel width of the second connection transistor CS2 in the upper part of FIG. 4 may have a value between the channel widths of two first connection transistors CS1 connected to the second connection node N2 in the upper part of FIG. 4 (i.e., to which the second connection transistor CS2 is connected).

In a conventional decoder, transistors constituting switch blocks are configured to have the same size. That is, the transistors constituting the switch blocks in the decoder are designed to endure the maximum reference voltage of the reference voltages received from the R-string by the switch blocks. In this case, since all of the transistors of the decoder have a size that endures the maximum reference voltage from the R-string, the decoder size increases, and thus, the power consumption may increase.

Particularly, switches of digital-to-analog converters in data drivers used for OLED TVs use high-voltage transistors. When the digital-to-analog converters are implemented using high-voltage transistors having the same size, the chip size of the data driver and the size of a display apparatus including the data driver (for example, an OLED TV) increase, and thus power consumption can increase.

However, in various embodiments of the present invention, it is possible to reduce (i) the size of digital-to-analog converters (e.g., DAC_1 to DAC_n in FIG. 2), (ii) the size of data drivers including the digital-to-analog converters, and (iii) the size of a display apparatus including the data drivers, by dividing reference voltages from the R-string into a plurality of voltage groups and differentiating the sizes of connection transistors and/or the sizes and/or breakdown voltages of transistors in the different switch blocks in accordance with the divided reference voltage groups.

Furthermore, power consumption may be reduced as the size of the digital-to-analog converters DAC_1 to DAC_n decreases in various embodiments of the present invention.

Figure 6:
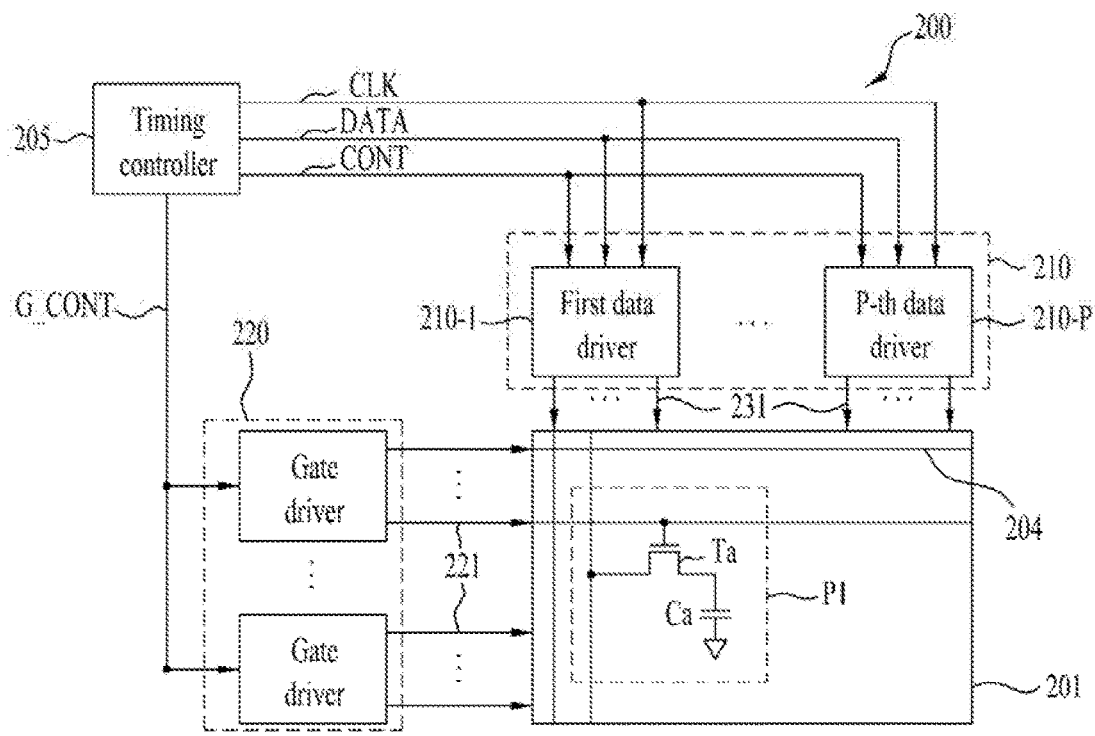
FIG. 6 illustrates an exemplary display apparatus including the data driver according to one or more embodiments of the present invention.

FIG. 6 illustrates an exemplary display apparatus 200 including a plurality of data drivers (e.g., each of which may comprise the data driver 100 of FIG. 1), according to one or more embodiments of the present invention.

Referring to FIG. 6, the display apparatus 200 includes a display panel 201, a timing controller 205, a data driver unit 210, and a gate driver unit 220.

The display panel 201 may include gate lines 221 in rows, data lines 231 in columns that intersect the gate lines in a matrix, and pixels (e.g., P1) connected to respective ones of the gate lines and intersecting data lines in the matrix. There may be multiple pixels, and each pixel P1 may include a transistor Ta and a capacitor Ca.

The timing controller 205 outputs a clock signal CLK, data DATA, a data control signal CONT configured to control the data driver unit 210, and a gate control signal G_CONT configured to control the gate driver unit 220.

For example, the data control signal CONT may include the horizontal start signal, the first control signal LD, and the enable signal En input to the shift register 110 of FIG. 1.

The gate driver unit 220 drives the gate lines and may include a plurality of gate drivers that output a gate control signal configured to control the transistors Ta of the pixels in the display panel 201.

The data driver unit 210 drives the data lines and may include a plurality of data drivers 210-1 to 210-P (P being a natural number greater than 1).

Each of the data drivers 210-1 to 210-P (P being a natural number greater than 1) may be or comprise the data driver 100 illustrated in FIG. 1.

The display apparatus 200 according to various embodiments may improve the digital-to-analog conversion speed of the digital-to-analog converters in the data drivers, and thus may achieve a relatively high definition.

Features, structures, effects and the like described in various embodiments are in at least one embodiment of the present invention and are not necessarily limited to only one embodiment. Further, features, structures, effects and the like exemplified in each embodiment may be combined or modified to be embodied by those skilled in the art for other embodiments. Therefore, such combination and modification should be construed as within the scope of the present invention.

What is claimed is:

1. A digital-to-analog converter, comprising:
a voltage generator configured to generate a plurality of voltage groups, each of the plurality of voltage groups having a plurality of reference voltages; and
a decoder having an output node configured to output one of the pluralities of reference voltages from any of the plurality of voltage groups,
wherein the decoder includes:
switch blocks that correspond to the plurality of voltage groups; and
first to (m−1)-th connection transistors between a first connection node and an m-th connection node, m being a natural number greater than 1,
each of the switch blocks includes transistors that are turned on or off by or in response to a control signal,
the first connection node is directly connected to a first transistor in a first one of the switch blocks and to a second transistor in a second one of the switch blocks,
the m-th connection node is directly connected to two neighboring (m−1)-th connection transistors,
each of the (m−1)-th connection transistors is between an (m−1)-th connection node and the m-th connection node,
a first voltage group corresponding to the first transistor is higher than a second voltage group corresponding to the second transistor,
a size of the first transistor is greater than a size of the second transistor,
one of the (m−1)-th connection transistors has a same size as a size of a third transistor of the first one of the switch blocks, and
the first switch block receives reference voltages equal to or higher than a voltage of the (m−1)-th connection node to which the one of the (m−1)-th connection transistors is connected.

2. The digital-to-analog converter according to claim 1, wherein the first transistor in the first one of the switch blocks has a breakdown voltage that is higher than that of the second transistor in the second one of the switch blocks.

3. The digital-to-analog converter according to claim 1, wherein the one of the (m−1)-th connection transistors has a size that is greater than a size of another one of the (m−1)-th connection transistors, and
a voltage to the (m−1)-th connection node to which one end of the one of the (m−1)-th connection transistors is connected is higher than a voltage to the (m−1)-th connection node to which one end of the other one of the (m−1)-th connection transistors is connected.

4. The digital-to-analog converter according to claim 3, wherein the breakdown voltage of the one of the (m−1)-th connection transistors is higher than that of the other one of the (m−1)-th connection transistors, and
a voltage to the (m−1)-th connection node to which the one end of the one of the (m−1)-th connection transistors is connected is higher than a voltage to the (m−1)-th connection node to which the one end of the other of the (m−1)-th connection transistors is connected.

5. The digital-to-analog converter according to claim 1, wherein breakdown voltages of transistors of each switch block are equal to or higher than a maximum reference voltage of the reference voltages corresponding to said switch block.

6. The digital-to-analog converter according to claim 1, wherein the voltage generator includes reference voltage output nodes configured to output the plurality of reference voltages, and transistors of the switch blocks are in a binary tree structure between the reference voltage output nodes and the first connection node.

7. The digital-to-analog converter according to claim 6, wherein the first to (m−1)-th connection transistors are in a binary tree structure between the first to m-th connection nodes.

8. The digital-to-analog converter according to claim 7, wherein the m-th connection node comprises the output node of the decoder.

9. The digital-to-analog converter according to claim 6, wherein the voltage generator includes a resistor string having serially connected resistors, and
the reference voltage output nodes include a connection node of two neighboring resistors of the serially connected resistors.

10. The digital-to-analog converter according to claim 9, wherein the plurality of voltage groups have sequential and consecutive voltage ranges between a first voltage and a second voltage, and each of the plurality of voltage groups has a different voltage range.

11. The digital-to-analog converter according to claim 1, wherein the channel widths of the (m−1)-th connection transistors are different from those of (m−2)-th connection transistors.

12. The digital-to-analog converter according to claim 11, wherein the channel width of the one of the (m−1)-th connection transistors has a value between the channel widths of two (m−2)-th connection transistors directly connected to an (m−1)-th connection node to which the one of the (m−1)-th connection transistors is connected.

13. A data driver comprising:
a data storage unit configured to store a data signal;
a level shifting block configured to shift a voltage level of the data signal and output a level-shifted data signal; and
the analog-to-digital converter according to claim 1, configured to output one of the plurality of reference voltages based on or in response to the level-shifted data signal.

14. A display apparatus comprising:
a display panel including gate lines in rows, data lines in columns and intersecting the gate lines in a matrix, and pixels each connected to respective gate lines and intersecting data lines;
a gate driver configured to drive the gate lines; and
the data driver according to claim 13, configured to drive the data lines.

15. The digital-to-analog converter according to claim 1, wherein the transistors of each of the switch blocks are connected to the reference voltage output nodes on which the reference voltages of the voltage group corresponding to the each of the switch blocks are output.

16. The digital-to-analog converter according to claim 1, wherein the first connection transistor is coupled to the first connection node, and the first connection transistor has a same size as a size of the first transistor in the first one of the switch blocks.

17. The digital-to-analog converter according to claim 1, wherein the size of the first transistor is a channel width or gate width of the first transistor and the size of the second transistor is a channel width or gate width of the second transistor, and the size of the transistor of the first switch block of the switch blocks is a channel width or gate width thereof.

* * * * *